US012725066B2

(12) United States Patent
Chih et al.

(10) Patent No.: US 12,725,066 B2
(45) Date of Patent: Sep. 1, 2026

(54) COMPUTATION IN MEMORY FOR ANNEAL PROCESSING USING BITWISE CAPACITIVE COUPLING

(71) Applicant: Taiwan Semiconductor Manufacturing Co., Ltd., Hsinchu (TW)

(72) Inventors: Yu-Der Chih, Hsinchu (TW); Chun-Yen Yao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1055 days.

(21) Appl. No.: 17/862,173

(22) Filed: Jul. 11, 2022

(65) Prior Publication Data

US 2024/0013083 A1 Jan. 11, 2024

(51) Int. Cl.
*G06N 10/40* (2022.01)
*G06N 10/60* (2022.01)
*G11C 7/12* (2006.01)
*H03K 19/21* (2006.01)

(52) U.S. Cl.
CPC ............. *G06N 10/40* (2022.01); *G06N 10/60* (2022.01); *G11C 7/12* (2013.01); *H03K 19/21* (2013.01)

(58) Field of Classification Search
CPC ............................... G06N 10/40; G06N 10/60
See application file for complete search history.

(56) References Cited

U.S. PATENT DOCUMENTS

2011/0084314 A1* 4/2011 Or-Bach ................ H10B 20/00 257/209
2015/0111754 A1* 4/2015 Harris ...................... H03K 3/38 365/162
2016/0300155 A1* 10/2016 Betz ....................... H10D 64/27
2024/0419997 A1* 12/2024 Huang ................... G06G 7/184
2025/0105828 A1* 3/2025 Ignjatovic ............. H03K 19/21

FOREIGN PATENT DOCUMENTS

CN 114386211 A 4/2022
CN 114417543 A 4/2022

* cited by examiner

*Primary Examiner* — Michael D. Yaary
(74) *Attorney, Agent, or Firm* — Seed IP Law Group

(57) ABSTRACT

An annealing processor utilizes capacitive spin update circuits to generate values for determining if spin states should be updated. Each capacitive spin update circuit induces a voltage on a main capacitor via capacitive coupling with a plurality of capacitors of corresponding bit cells. Each bit cell receives a spin value and a spin coupling value. The induced charge is based, in part, on the spin values and spin coupling values.

20 Claims, 13 Drawing Sheets

100

COMPUTATION IN MEMORY FOR ANNEAL PROCESSING USING BITWISE CAPACITIVE COUPLING

BACKGROUND

Combinatorial optimization problems appear in a large variety of applications. Such applications can include machine learning applications, operational planning, logistical planning, drug discovery, and other types of applications that may involve a large number of variables that may each interact with each other. Such problems may be classified as nondeterministic polynomial (NP) problems. Some of the problems may be classified as NP hard or NP complete. Such problems may be very difficult to solve.

In order to solve such problems, new hardware architectures called annealers have been developed. Annealers may solve combinatorial optimization problems by treating each of a large number of variables as “spin states” that can each have one of two values and that exert influence on each other. A Hamiltonian function can be utilized to model the “energy” of such a system. Finding the ground state of the Hamiltonian function may correspond to finding a suitable solution to the combinatorial problems.

Quantum annealers utilize quantum computing in order to solve combinatorial problems. While quantum annealers may be very effective in solving combinatorial problems, quantum annealers can be prohibitively expensive to acquire and operate. CMOS annealers can be utilized in place of quantum annealers. While CMOS annealers are easier to produce, traditional CMOS annealers have generally been less effective in solving combinatorial problems in a timely or satisfactory manner. The result is that combinatorial problems remain expensive and difficult to solve.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
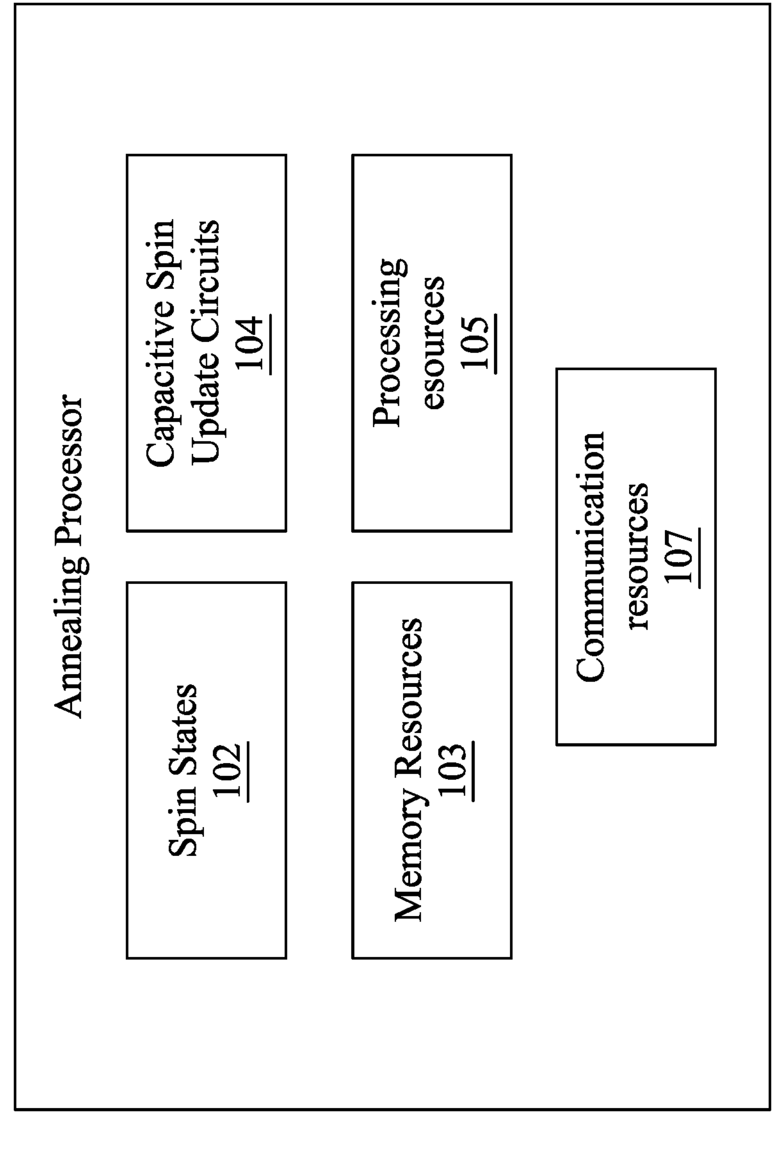
FIG. 1A is a block diagram of a CMOS based annealing processor, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word “comprise” and variations thereof, such as “comprises” and “comprising,” are to be construed in an open, inclusive sense, that is, as “including, but not limited to.”

The use of ordinals such as first, second and third does not necessarily imply a ranked sense of order, but rather may only distinguish between multiple instances of an act or structure.

Reference throughout this specification to “one embodiment” or “an embodiment” means that a particular feature, structure or characteristic described in connection with the embodiment is included in at least some embodiments. Thus, the appearances of the phrases “in one embodiment”, “in an embodiment”, or “in some embodiments” in various places throughout this specification are not necessarily all referring to the same embodiment. Furthermore, the particular features, structures, or characteristics may be combined in any suitable manner in one or more embodiments.

As used in this specification and the appended claims, the singular forms “a,” “an,” and “the” include plural referents unless the content clearly dictates otherwise. It should also be noted that the term “or” is generally employed in its sense including “and/or” unless the content clearly dictates otherwise.

Embodiments of the present disclosure provide a CMOS based annealing processor that can effectively and efficiently solve combinatorial optimization problems. A combinatorial optimization problem is modeled as a plurality of spin states that are each coupled with the other spin states. The annealing processor includes a plurality of capacitive spin update circuits. Each capacitive spin update circuit is able to determine whether a spin state should be updated based on the values of all of the other spin states and corresponding coupling values. The capacitive spin update circuits operate in parallel with each other such that multiple spin states can be updated substantially simultaneously with each other.

Each capacitive spin update circuit includes a bit cell for each spin state. Each bit cell includes one or more logic gates and a first capacitor. Each first capacitor is coupled to a bitline. Each bit cell represents a respective spin state and receives a spin value of the spin state and a coupling value associated with the spin state. The spin update circuit includes a second capacitor that can be selectively coupled and decoupled from the bitline. During a spin update process, each first capacitor is charged to a value based on the corresponding spin state value and spin coupling value. A voltage is induced on the second capacitor via capacitive coupling with each of the first capacitors. The spin update circuit determines whether or not a spin value should be updated based, in part, on the voltage induced on the second capacitor.

The function of the logic gate and the capacitive coupling of each of the bit cells results in an efficient and effective process for updating spin states in a fully connected manner. The result is a CMOS based annealing process with low area overheads, rapid computation, and low power consumption. The CMOS annealing processor can, thus, be utilized to solve very difficult combinatorial optimization problems effectively and efficiently.

FIG. 1A is a block diagram of an annealing processor 100, in accordance with some embodiments. The annealing processor 100 is configured to solve combinatorial optimization problems in an effective and efficient manner. The annealing processor 100 models the variables of a combinatorial optimization problem as spin states 102. The annealing processor 100 also includes a plurality of capacitive spin update circuits 104. As will be set forth in more detail below, the capacitive spin update circuits 104 can be utilized to effectively and efficiently update the spin states 102 as part of solving combinatorial optimization processes.

A combinatorial optimization problem is a problem that tries to find the values of a plurality of variables that results in a desired overall value. Each variable may exert an influence on all of the other variables. Even with a relatively small number of variables, finding a set of values for the variables that results in a desired overall value can be very computationally difficult.

As used herein, “optimization” may correspond to finding a set of values for variables that results in a desired or satisfactory overall value in a combinatorial problem. As used herein, “optimization” is not limited to finding the very best possible solution. In some cases, “optimization” may refer to finding a set of values that results in an overall value that satisfies a threshold constraint or another kind condition.

Examples of combinatorial optimization problems can include determining an efficient route for delivering commodities to a large number of locations, determining how to perform machine learning processes quickly, identifying pharmaceutical compositions, and other types of problems. Such combinatorial optimization problems may be classified as NP hard or NP complete. Such problems may be very difficult to solve.

The annealing processor 100 defines combinatorial optimization problems as an abstracted physical model, such as an Ising model. An Ising model models optimization problems as a collection of spins and couplings. More particularly, each variable in a combinatorial optimization problem is modeled as a spin state that can have a value of either +1 or −1. Furthermore, each spin state interacts with one or more other spin states. Accordingly, each spin is subjected to an external force of + or − from the other spin states with which it is coupled. The terminology of “spin states” has been adopted due to a historical implementation of Ising models in which magnetization of a material was modeled and the physical spin states played a role in the overall magnetization. However, as used herein, “spin state” may not refer to an actual quantum mechanical spin state or other type of physical spin. Instead, as used herein, “spin state” may refer to a variable that can have one of two values in a combinatorial optimization problem.

Figure 1C:
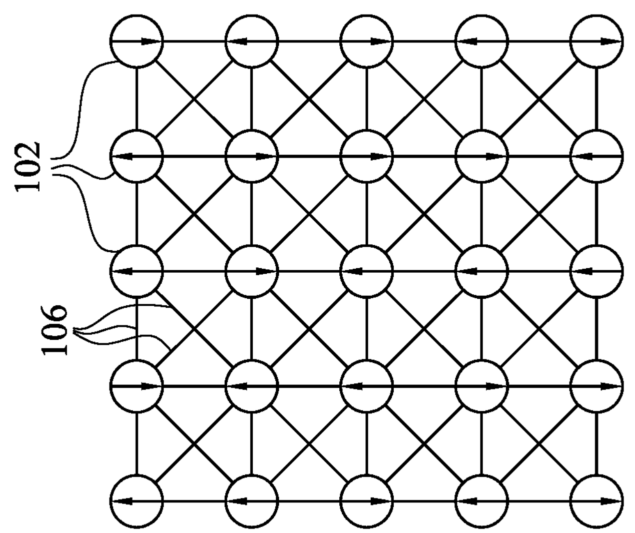
FIG. 1C illustrates spin states modeled in a sparsely connected manner, in accordance with some embodiments.
Figure 1B:
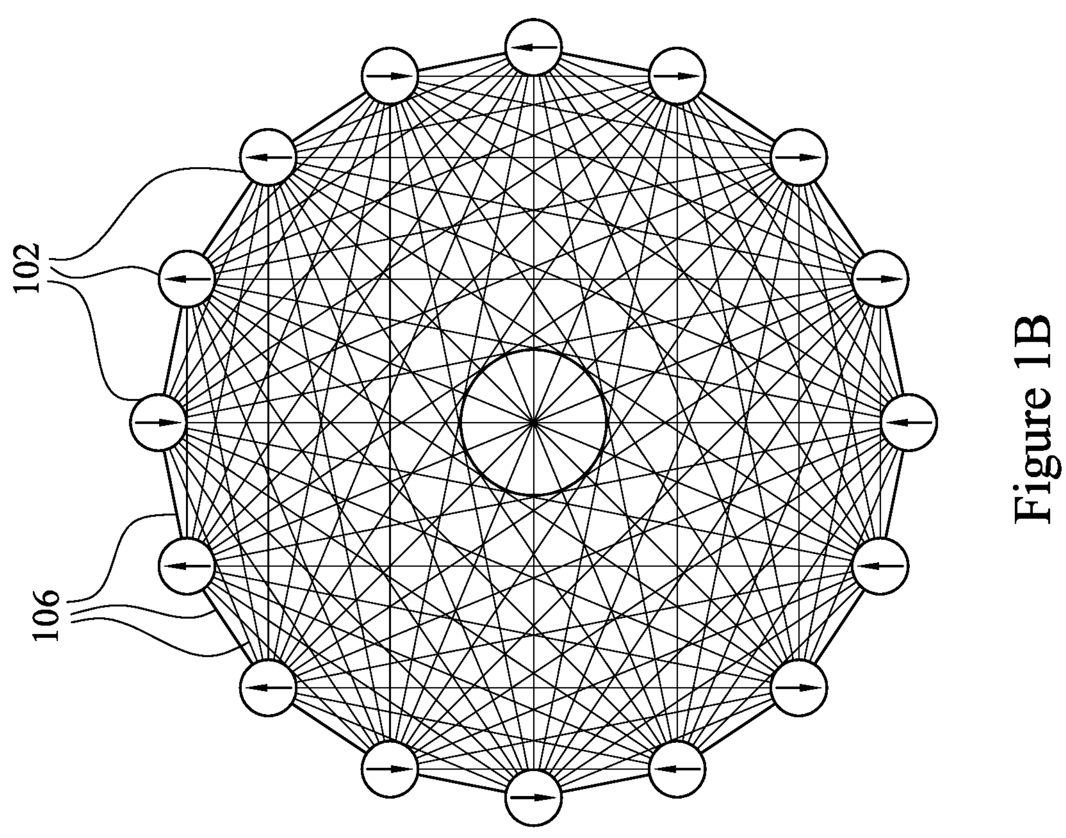
FIG. 1B illustrates spin states modeled in a fully connected manner, in accordance with some embodiments.
Figure 1D:
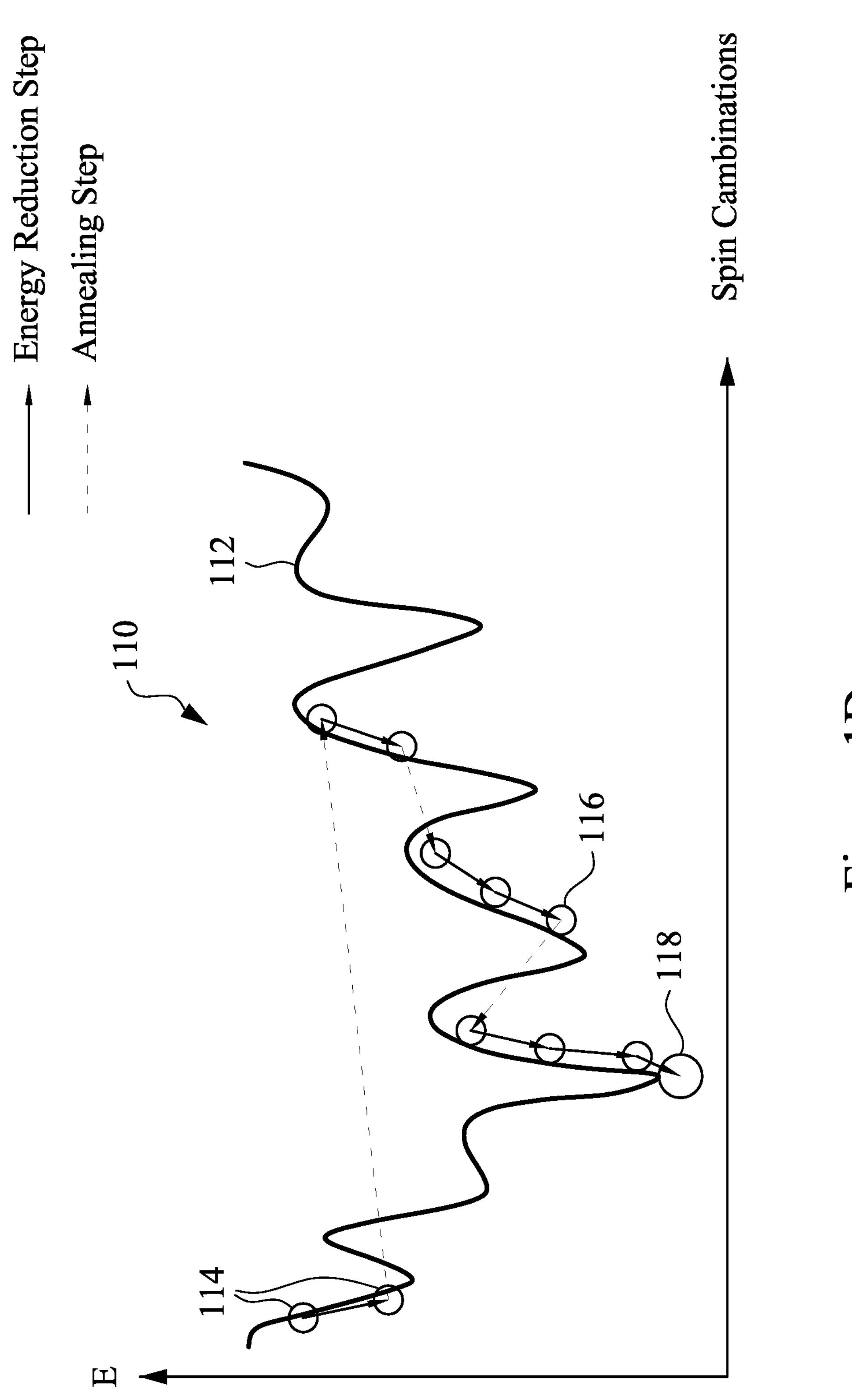
FIG. 1D is a graph illustrating aspects of an annealing process utilized in solving combinatorial problems, in accordance with some embodiments.

Prior to further discussing the annealing processor 100 of FIG. 1A, it is beneficial to discuss fully connected models, sparsely connected models, and Ising models with respect to FIGS. 1B-1D. FIG. 1B is an illustration of a plurality of spin states 102 in a fully connected model, in accordance with some embodiments. Each spin state 102 is a variable in a combinatorial optimization problem. Each spin state 102 is shown as having up spin or down spin. However, descriptions herein refer to spin values of +1 or −1. Accordingly, up spin can be correspond to a spin value of +1 and down spin can correspond to a spin value of −1.

FIG. 1B is a fully connected model. In a fully connected model, each spin state 102 is coupled to every other spin state by a coupling 106. This means that each spin state exerts influence on every other spin state in such a model. Each spin state 102 may be thought of as a vertex or node. Each coupling 106 may be thought of as an edge that couples two nodes. As will be described in further detail below, due to the capacitive spin update circuits 104, the annealing processor 100 of FIG. 1A is capable of solving combinatorial optimization processes in which the nodes 102 are fully connected.

FIG. 1C is an illustration of a plurality of spin states 102 in a sparsely connected model, in accordance with some embodiments. In the sparsely connected model, each spin state 102 is coupled only to those spin states 102 that are immediately adjacent in vertical, horizontal, or diagonal directions. Accordingly, each spin state 102 is connected by eight couplings 106 to eight adjacent spin states 102. The annealing processor 100 of FIG. 1 can be utilized to solve combinatorial optimization problems modeled as a sparsely connected models. Nevertheless, examples described in the present disclosure may focus primarily on solving fully connected models.

FIG. 1D is a graph of an Ising model 110, in accordance with some embodiments. The Ising model 110 includes a curve 112. Each point 114 on the curve 112 corresponds to a particular combination of spin values for the spin states 102. The vertical axis of the graph 110 corresponds to the overall energy for each combination of spin values.

The annealing processor 100 solves the combinatorial optimization problem by finding the point of lowest energy on the curve 112. The point of lowest energy is the vertically lowest point on the graph 110, or the ground state 118. The annealing processor 100 sequentially adjusts spin state combinations seeking to find the ground state 118.

As can be seen in FIG. 1D in addition to the ground state 118, there are various local minima 116 throughout the curve 112. It is possible that an annealing processor may mistakenly identify a local minima 116 as the ground state 118. The annealing processor 100 avoids this by performing annealing steps in addition to sequential spin configuration updates. The annealing process may include a more radical reconfiguration of spin states in an effort to bypass local minima. These more radical reconfigurations are called annealing steps. Through the process of performing annealing steps and spin configuration updates, the annealing processor 100 efficiently finds the ground state 118, corresponding to the lowest energy configuration of spin states.

In some embodiments, the energy of a combinational optimization problem is modeled with the Hamiltonian function:

$$H(\sigma) = -\sum_{i=1}^{N} h_i\sigma_i - \sum_{i,j=1,i<j}^{N} J_{ij}\sigma_i\sigma_j,$$

where $\sigma_i$ is the spin value of a spin state a with index i among N spin states, $h_i$ is an external magnetic field value at the location of the spin state $\sigma_i$, $\sigma_j$ is the spin value of a spin state a with index j among all spin states other than the current spin state of index i, and $J_{ij}$ is the coupling value between the spin states $\sigma_i$ and $\sigma_j$. Accordingly, the Hamiltonian function sums the energy from the external magnetic field $h_i$ acting on each spin state and the energy from the coupling value $J_{ij}$ acting between each pair of spin states. The magnetic field value $h_i$ may refer to external influences other than a magnetic field, depending on the particular combinatorial optimization problem being solved.

Returning to FIG. 1A, the annealing processor utilizes the capacitive spin update circuits 104 to determine if the spin value of each spin state should be updated. In one embodiment, there is a respective capacitive spin update circuit 104 for each spin state. Accordingly, a capacitive spin update circuit 104 is assigned to a particular spin state. The spin state associated with a capacitive spin update circuit 104 may be referred to as a primary spin state. All other spin states may be referred to as secondary spin states. The capacitive spin update circuit 104 receives the current spin values of all secondary spin states and the spin coupling values between the primary spin state and all other secondary spin states. The capacitive spin update circuit 104 charges a main capacitor to a voltage based on the secondary spin values and spin coupling values. The capacitive spin update circuit 104 generates an output value based, at least in part, on the voltage on the main capacitor. The output value can be utilized to determine whether or not the primary spin value should be updated.

As set forth previously, there is a respective capacitive spin update circuit 104 for each spin state. Each capacitive spin update circuit 104 can generate an output value based on the secondary spin values and coupling values. The capacitive spin update circuits 104 can operate in parallel such that each capacitive spin update circuit 104 generates an output value in parallel. Thus, not only does each capacitive spin update circuit 104 generate an output value in a fully connected manner, but all of the capacitive spin update circuits 104 operate in parallel. The result is effective and efficient process for determining which spin states should be updated and which should remain unchanged.

In some embodiments, each capacitive spin update circuit 104 includes a respective bit cell for each secondary spin state. Each bit cell includes one or more logic gates and a first capacitor. A first plate of the first capacitor is coupled to the output of the one or more logic gates. The one or more logic gates receive the spin value of the secondary spin state and the coupling value between the secondary spin state and the primary spin state. The capacitive spin update circuit 104 includes a main bitline. The second plates of each of the first capacitors of the bit cells are connected to the main bitline. The main capacitor can be selectively coupled and decoupled from the main bitline by a switch. Each capacitive spin update circuit 104 can include a comparator having a first input coupled to the main capacitor and the second input coupled to a second capacitor.

In some embodiments, during a spin update process, each of the first capacitors is charged to a voltage based on the corresponding spin value and spin coupling value. Because the first capacitors are all capacitively coupled to the main capacitor via the bitline when the switch selectively couples the main capacitor to the main bitline, the first capacitors induce a voltage on the main capacitor based on the secondary spin state values and the spin coupling values. The comparator generates the output value of the capacitive spin update circuit 104 by comparing the voltage on the main capacitor to a voltage on the second capacitor.

The output value of the capacitive spin update circuit 104 can be utilized to determine whether the spin value of the primary spin states should be updated. The output values of all the capacitive spin update circuits 104 can be utilized to compute the value of the Hamiltonian function. Further details regarding the capacitive spin update circuits 104 will be provided in relation to FIG. 3.

In one embodiment, the annealing processor includes processing resources 105, memory resources 103, and communication resources 107. The processing resources 105 can include one or more controllers, processors, hardware accelerators. The processing resources 105 are configured to execute software instructions, process data, perform signal processing, read data from memory, write data to memory, and to perform other processing operations.

In one embodiment, the memory resources 103 can include one or more computer readable memories. The memory resources 103 are configured to store values related to spin states, coupling values, external fields, overall energy, software instructions associated with the function of the annealing processor and its components. The memory resources 103 can store data associated with the function of the annealing processor 100 and its components.

The annealing processor 100 provides various benefits. These benefits include operating fully connected spin states, computation of spin state update values in memory, computation of spin state update values with charge computation, no transistor mismatch issues in memory, low bit cell overhead, low energy consumption, and fast computation. In some embodiments, computation includes resetting the capacitive spin update circuits, performing charge accumulation with a main capacitor, weighted addition of charges with secondary capacitors, and simple subtraction or comparison with the main capacitor and one or more of the secondary capacitors.

Figure 2:
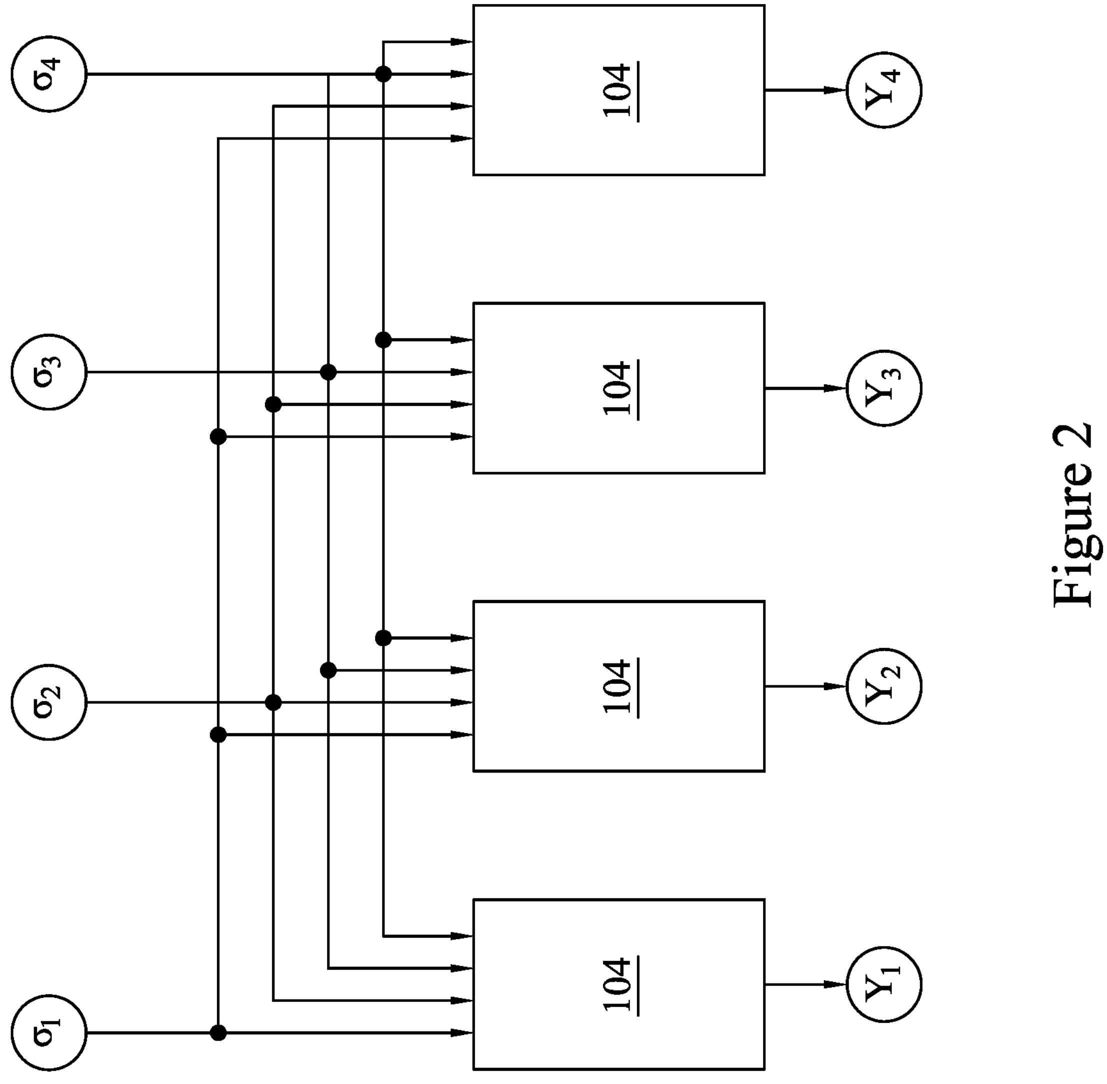
FIG. 2 is a block diagram of a plurality of capacitive spin update circuits, in accordance with some embodiments.

FIG. 2 illustrates a plurality of capacitive spin update circuits 104, in accordance with some embodiments. In the example of FIG. 2, there are four spin states $\sigma_{1-4}$. The spin state 61 is the primary spin state for the leftmost capacitive spin update circuit 104. The spin states $\sigma_{2-4}$ are the secondary spin states from the leftmost capacitive spin update circuit 104. The spin state $\sigma_2$ is the primary spin state for the capacitive spin update circuit 104 second from the left. The spin states $\sigma_{1,\ 3-4}$ are the secondary spin states from capacitive spin update circuit 104 second from the left. The spin state $\sigma_3$ is the primary spin state for the capacitive spin update circuit 104 second from the right. The spin states $\sigma_{1-2,4}$ are the secondary spin states from capacitive spin update circuit 104 second from the right. The spin state $\sigma_4$ is the primary spin state for the rightmost capacitive spin update circuit 104. The spin states $\sigma_{1-3}$ are the secondary spin states from the rightmost capacitive spin update circuit 104.

Each of the capacitive spin update circuits 104 generates a respective output value $\tau_{1-4}$. The output values may indicate whether or not a spin state should be updated. The output values may be utilized to determine whether or not a spin state should be updated. The output values may be utilized to determine the overall value of the Hamiltonian function. As can be seen in FIG. 2, each of the capacitive spin update circuits 104 can operate in parallel. Furthermore, because each capacitive spin update circuit 104 receives all of the secondary spin values and corresponding spin coupling values, the annealing process or 100 can operate as a fully connected annealing processes.

Figure 3A:
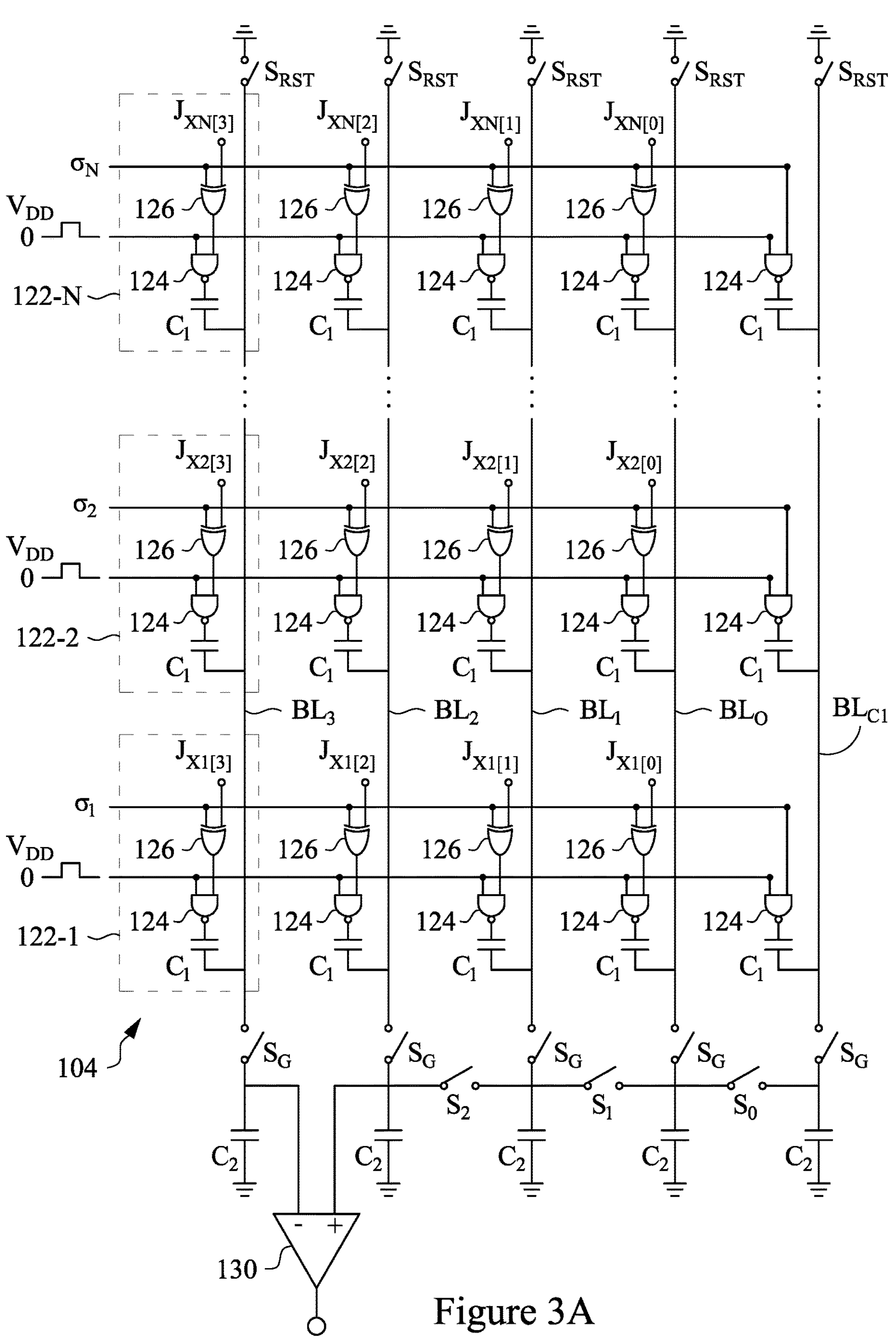
FIGS. 3A-3E are schematic diagrams of a capacitive spin update circuit at various stages of a spin update process, in accordance with some embodiments.

FIG. 3A is a schematic diagram of a capacitive spin update circuit 104, in accordance with some embodiments. FIGS. 3B-3E correspond to the capacitive spin update circuit 104 of FIG. 3A at various stages of a spin update process, in accordance with some embodiments. The capacitive spin update circuit 104 is one embodiment and the capacitive spin update circuit 104 of FIGS. 1A-2. The capacitive spin update circuit 104 is associated with a primary spin state $\sigma_x$ and N secondary spin states $\sigma_y$.

Referring to FIG. 3A, the capacitive spin update circuit 104 includes a primary bitline BL3. The capacitive spin update circuit 104 includes N bits cells $\mathbf{122}_{1-N}$. Each bit cell is associated with a corresponding secondary spin state $\sigma_{1-N}$. Each bit cell 122 includes a NAND gate 124, and an XOR gate 126. Each bit cell 122 includes a first capacitor C1 having a first terminal coupled to the output of the NAND gate and a second terminal coupled to the primary bitline BL3.

The capacitive spin update circuit includes a plurality of secondary bitlines BL2-BL0 and BLCL. Each of the secondary bitlines BL2-0 is coupled to a respective column of secondary bit cells. Each secondary bit cell is substantially identical to the bit cells $\mathbf{122}_{1-N}$. The secondary bitline BLCL is coupled to a group of bits cells that are similar to the bit cells 122 except that the XOR gate 126 is not present.

The capacitive spin update circuit 104 includes a plurality of capacitors C2. The capacitor C2 coupled to the inverting input of the comparator 130 may be termed a main capacitor. The capacitors C2 that are coupled or that can be selectively coupled to the non-inverting input of the comparator 130 may be termed secondary capacitors C2. The capacitive spin update circuit 104 includes a plurality of switches SG configured to selectively couple and decouple the capacitors C2 from the bitlines BL3-BLCL. The capacitive spin update circuit 104 includes a plurality of switches SRST configured to selectively couple and decouple the bitlines BL3-BLCL to ground. The capacitive spin update circuit 104 includes a plurality of switches S0-S2 configured to selectively couple and decouple the secondary capacitors C2 from each other.

The capacitive spin update circuit 104 includes a comparator 130. The comparator 130 has an inverting input coupled to the main capacitor C2. The comparator 130 has a noninverting input coupled to the secondary capacitors C2.

In some embodiments, the capacitors C1 all have the same capacitance. In some embodiments, the capacitors C2 all have the same capacitance. In some embodiments, the capacitances of the capacitors C1 and C2 can have ranges between 1 pF and 100 nF, though other capacitance values can be utilized without departing from the scope of the present disclosure.

Each bit cell 122 receives the spin value of the corresponding secondary spin state $\sigma_y$, the coupling value $J_{xy[3]}$ associated with the secondary spin state $\sigma_y$ and the primary spin state $\sigma_x$, and a pulse value can be either 0 V or VDD. A spin value of +1 is represented by binary 0. A spin value of −1 is represented by binary 1. A first input of the XOR gate 126 receives the spin value and a second input of the XOR gate 126 receives the spin coupling value. A first input of the NAND gate 124 receives the pulse value of 0 or VDD. A second input of the NAND gate 124 is coupled to the output of the XOR gate 126. Each of the secondary bit cells receives the same secondary spin value as the bit cell 122 of the same row. The secondary bit cells receive a spin coupling value $J_{xy[K]}$, where K corresponds to the index of the connected secondary bitline. In one embodiment, $J_{xy}$ represents a multibit integer in which the index [n] represents the nth bits. The secondary bit cells also receive the same pulse value as the bit cells 122. One function of the XOR gate 126 is to convert $J_{xy}$ to the opposite polarity. For example, $-J_{xy}$ becomes approximately equal to $J_{x\ y}+1$. A spin state of +1 is represented by binary 0. A spin state of −1 is represented by binary 1.

The capacitive spin update circuit 104 of FIG. 3A is a 4-bit capacitive spin update circuit 104 due to the presence of four secondary bitlines BL2-BLCL. However, other numbers of secondary bitlines can be utilized to provide a different number of bits for the capacitive spin update circuit 104. A higher number of bits provides a greater resolution in the comparison between the voltages on the capacitors C2 coupled to the inverting and non-inverting inputs of the comparator 130, as will be described in more detail below. Various other configurations of a capacitive spin update circuit 104 can be utilized without departing from the scope of the present disclosure.

Figure 3B:
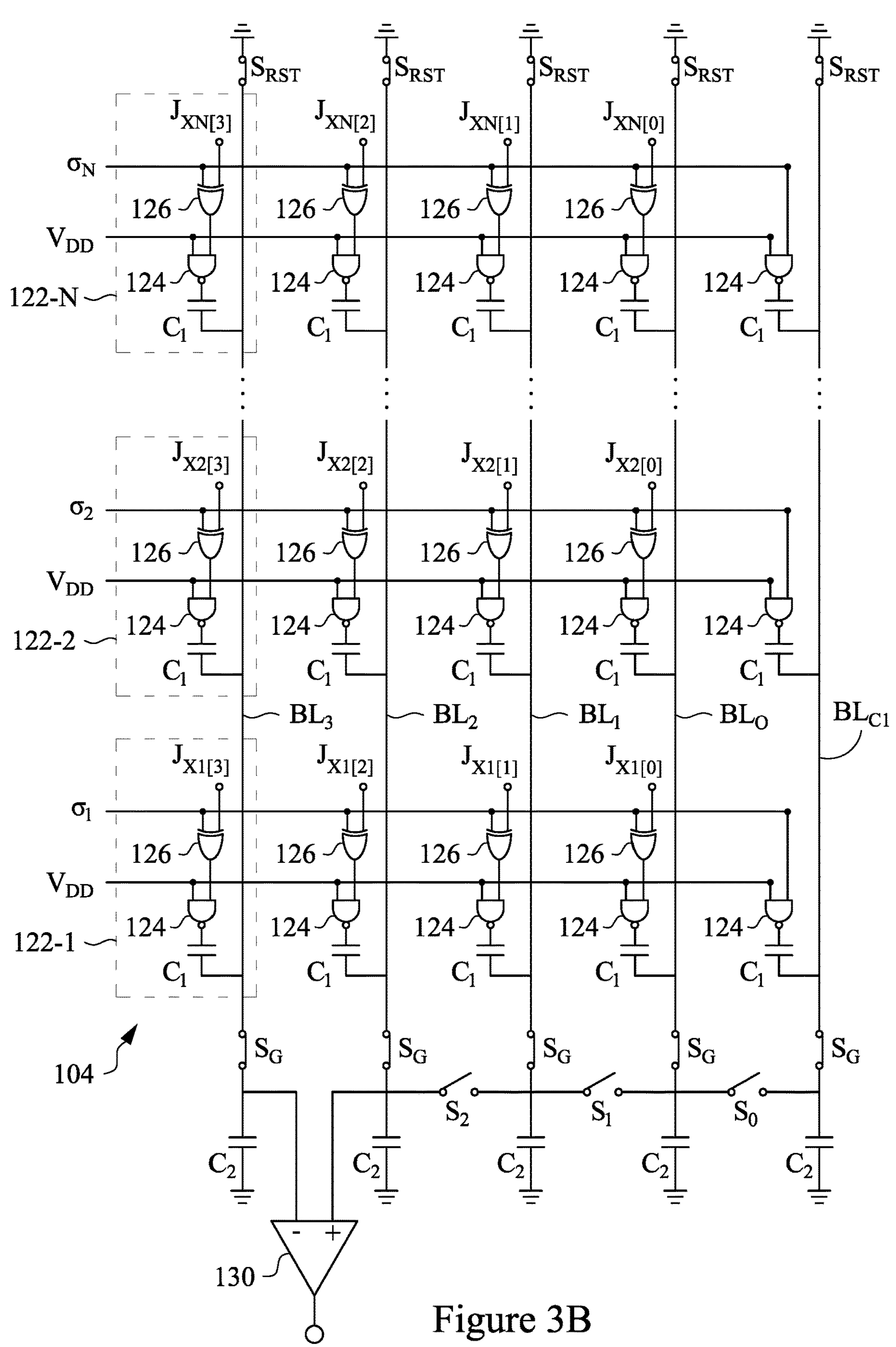

FIG. 3B illustrates the capacitive spin update circuit 104 at the beginning of a spin update process, in accordance with some embodiments. At the beginning of a spin update process, the switches SG and SRST are all closed. This has the effect of grounding the bitlines and capacitively coupling the capacitors C1 of the bitline BL3 to the main capacitor C2, capacitively coupling the capacitors C1 of the bitline B12 to the corresponding secondary capacitor C2, capacitively coupling the capacitors C1 of the bitline BL1 to the corresponding secondary capacitor C2, capacitively coupling the capacitors C1 of the bitline BL0 to the corresponding secondary capacitor C2, and capacitively coupling the capacitors C1 of the bitline BLCL to the corresponding secondary capacitor C2. In FIG. 3B, the value of the input pulse is VDD. In other words, the first input of each NAND gate 124 receives VDD. The voltage on the output of the upper node of the capacitors C1 depends on the corresponding XOR of $\sigma_y$ and $J_{xy}$.

Figure 3C:
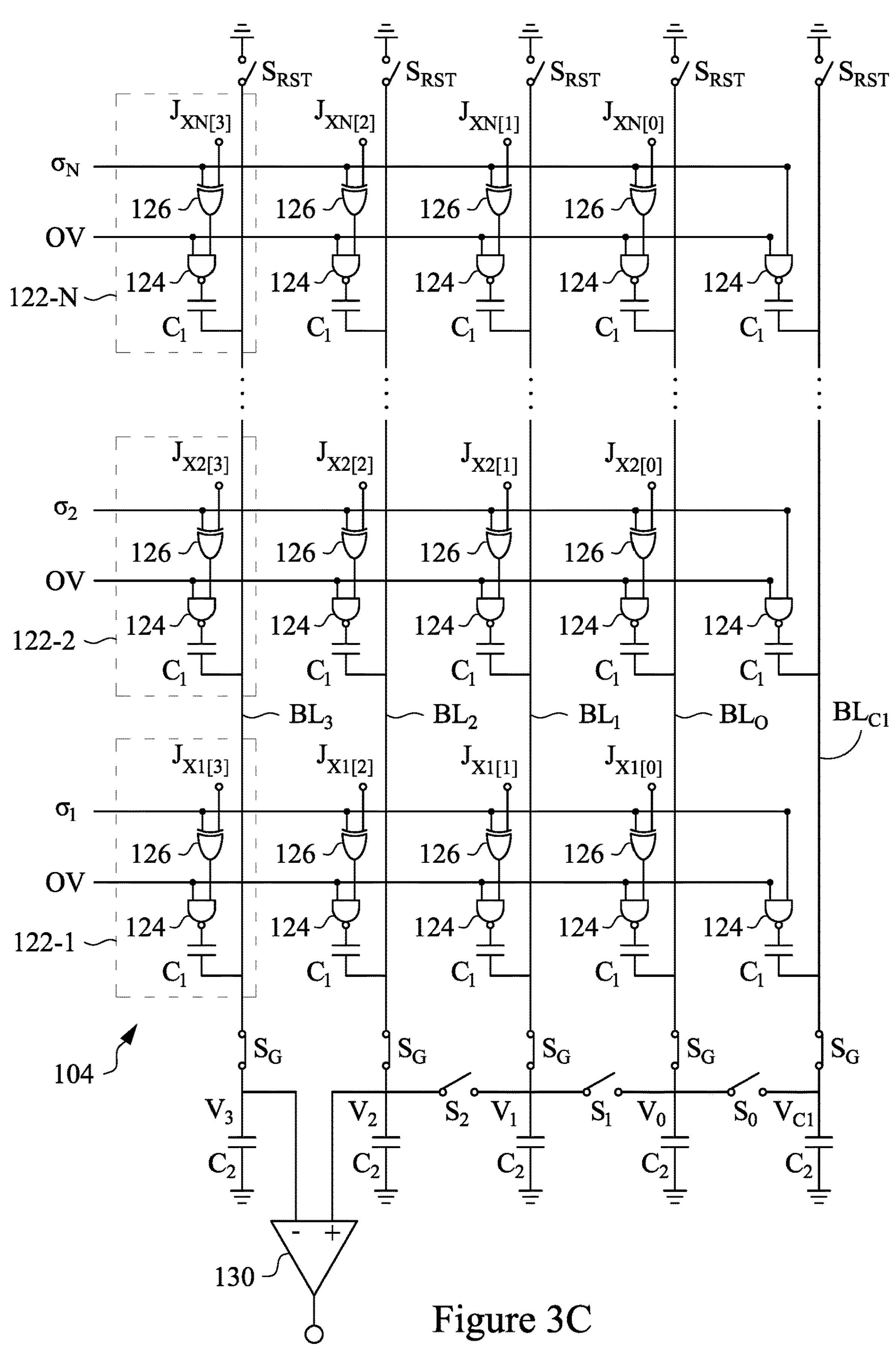

In FIG. 3C, the switches SRST are opened. This decouples the bitlines from ground. After the switches SRST are open, VDD is removed from the first input of the NAND gates 124 and 0 V is applied to the first inputs of the NAND gates 124. When the pulse goes from VDD to 0V, the voltage on each upper node of the capacitors C1 becomes VDD. The voltage on the lower node of the capacitors C1 is based on the XOR of $\sigma_y$ and $J_{xy}$ for the various bit cells 122. Due to the capacitive coupling between the capacitors C1 of the bit cells 122 and the main capacitor C2, the voltage V3 on the main capacitor C2 will be based on the voltage across the various capacitors V1 of the corresponding bit line. Based on charge equilibrium between the capacitively coupled capacitors C1 and C2, the following relationship can be devised:

$$(N-m)C_1(-V_{DD}) = NC_1(V_3 - V_{DD}) + C_2V_3,$$

where N is the number of rows (or the number of secondary spin states) and m is the number of discharged NAND gates of the bit cells 122. Solving relationship above for V3 gives the following relationship:

$$V_3 = \frac{mC_1}{NC_1 + C_2}V_{DD}.$$

The number m of discharged NAND outputs can be given by the following relationship:

$$m = \Sigma_{y,\sigma_y=1}J_{xy}[3] + \Sigma_{y,\sigma_y=-1}\overline{J_{xy}[3]}.$$

Finally, by this we can derive that the voltage V3 can be given by the following relationship:

$$V_3 = \frac{C_1V_{DD}}{NC_1 + C_2}\left(\sum\nolimits_{y,\sigma_y=1}J_{xy}[3] + \sum\nolimits_{y,\sigma_y=-1}\overline{J_{xy}[3]}\right).$$

In FIG. 3B, a voltage V2 is also induced on the capacitor C2 of the bitline BL2 via capacitive coupling with the capacitors C1 of the bitline BL2. A voltage V1 is induced on the capacitor C2 coupled to the bitline BL1 via capacitive coupling with the capacitors C1 of the bitline BL1. A voltage V0 is induced on the capacitor C2 coupled to the bitline BL0 via capacitive coupling with the capacitors C1 of the bitline BL0. A voltage VCL is induced on the capacitor C2 coupled to the bitline BLCL via capacitive coupling with the capacitors C1 of the bitline BLCL.

Figure 3D:
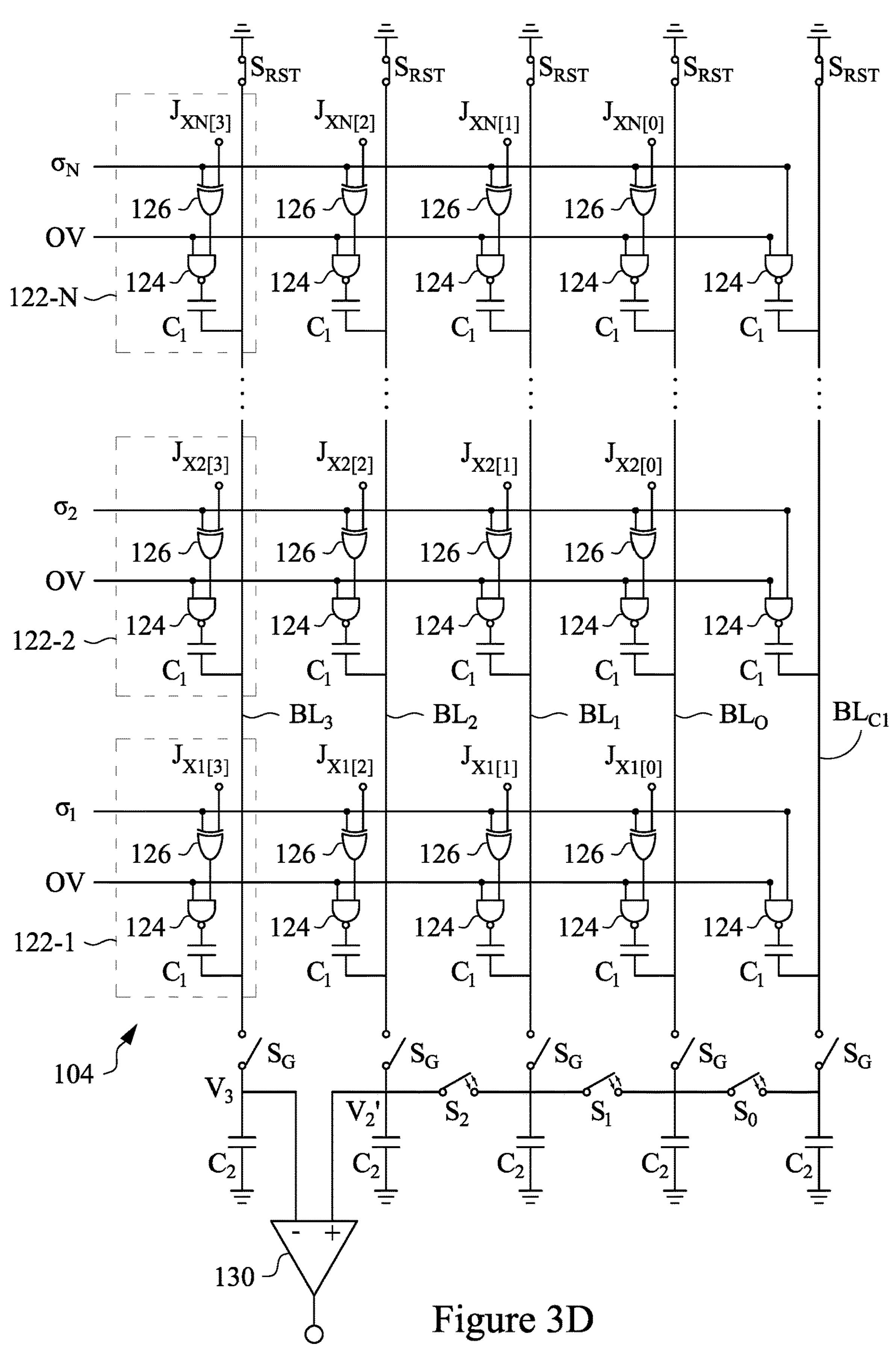

In FIG. 3D, the switches SG are opened. This has the effect of locking in the voltages V3-Vc1 on the capacitors C2. The switches SRST are then closed, grounding the bitlines BL3-BLCL. After the switches SG are opened and the switches SRST are closed, the switches S0-S2 are sequentially closed and opened. In particular, the switch S2 is closed and opened, so that charge is shared between the corresponding capacitors C2. The middle switch S1 is then closed and opened so that charge is shared between the corresponding capacitors C2. The switch S0 is then closed and opened. This results in charge sharing between the corresponding capacitors C2. After the charge sharing, the following relationship can be established:

$$\frac{1}{2^3}\left(\sum\nolimits_{k=0}^{2}2^k V_k + V_{CI}\right) = \frac{1}{2^3}\frac{C_1V_{DD}}{NC_1 + C_2}\left(\sum\nolimits_{k=0}^{2}2^k\left(\sum\nolimits_{y,\sigma_y=1}J_{xy}[k] + \sum\nolimits_{y,\sigma_y=-1}\overline{J_{xy}[k]}\right) + \sum\nolimits_{y,\sigma_y=-1}1\right),$$

where k refers to the index of the secondary bitlines BL2-BL0. The shared voltage V2' on the capacitor C2 coupled to the bitline BL2 can be given by:

$$V2' = \frac{V2}{2} + \frac{V1}{4} + \frac{V0}{8} + Vcl/8.$$

Figure 3E:
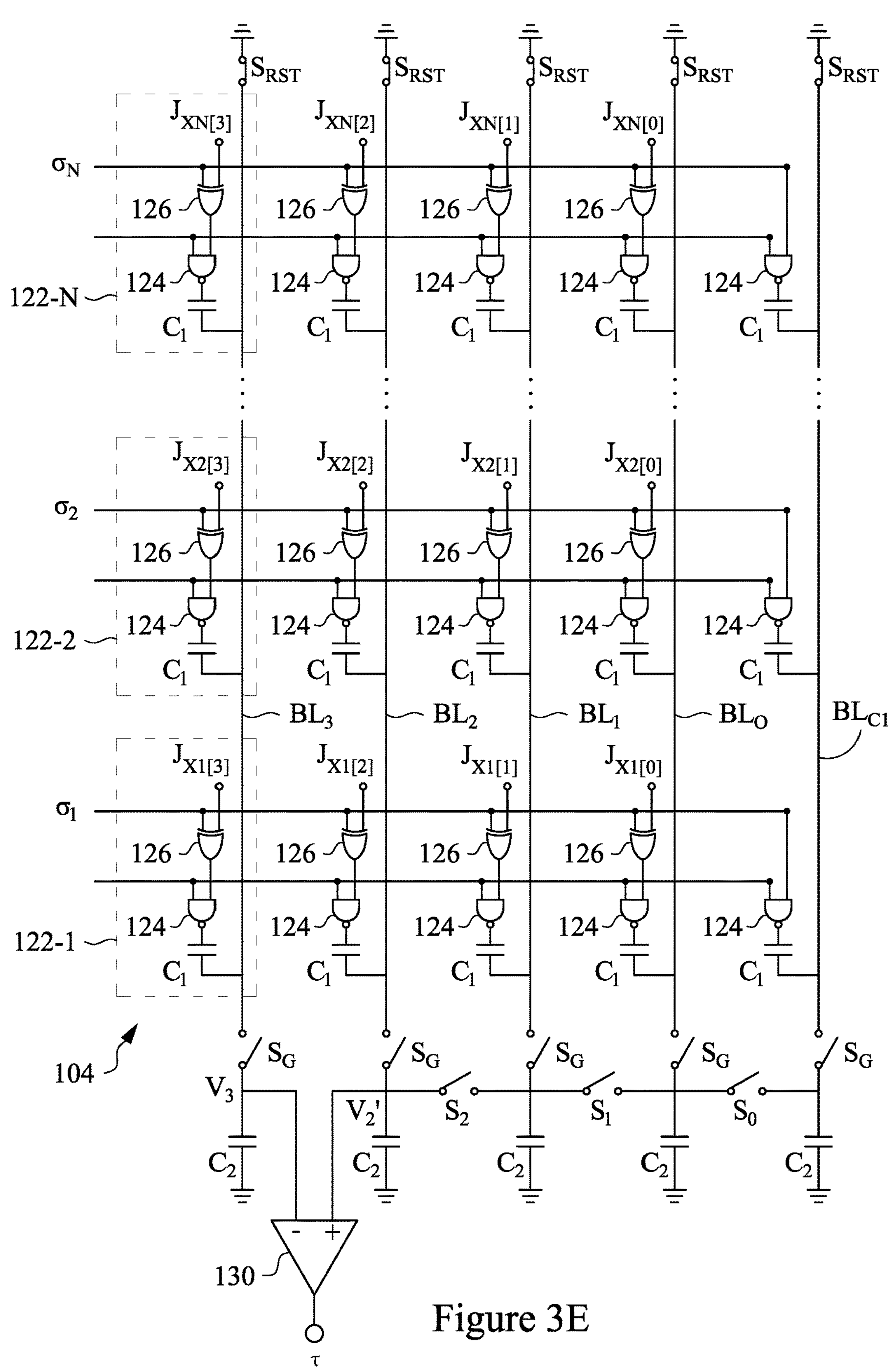

In FIG. 3E, the switches S0-S2 are all open so that the voltage V2' is locked. The comparator 130 then performs a comparison between V3 and V2' and provides an output value τ based on the comparison. The output value τ corresponds to the output of the capacitive spin update circuit 104. The output value τ is based on the following relationship:

$$\tau = \text{sgn}\left(\frac{1}{2^3}\left(\sum\nolimits_{k=0}^{2}2^k V_k + V_{CI}\right) - V_3\right) = \text{sgn}\left(\frac{1}{2^3}\frac{C_1V_{DD}}{NC_1 + C_2}\left(\begin{array}{c} -2^3\left(\sum\nolimits_{y,\sigma_y=1}J_{xy}[3] + \sum\nolimits_{y,\sigma_y=-1}\overline{J_{xy}[3]}\right) + \\ \sum\nolimits_{k=0}^{2}2^k\left(\sum\nolimits_{y,\sigma_y=1}J_{xy}[k] + \sum\nolimits_{y,\sigma_y=-1}\overline{J_{xy}[k]}\right) + \\ \sum\nolimits_{y,\sigma_y=-1}1 \end{array}\right)\right) = \text{sgn}\left(\sum\nolimits_{y}\sigma_y J_{xy}\right).$$

The output value τ can give an indication of whether or not the primary spin value ax associated with the capacitive spin update circuit 104 should be updated or not. The output value τ is based on the sign of the comparison between V3 and V2'.

In some embodiments, an analog sum operation is based on charge coupling and sharing. The switches SRST are open and the switches SG are closed. 0V is applied to an input of each NAND gate 126. For each column, C1 is used as a coupling capacitance to couple to C2. As a result, voltages V3, V2, V1, V0, and VC1 are induced on the capacitors C2 of each column. The switches SG are then opened. The switch S0 is then closed and opened, resulting in a voltage V0' equal to half the sum of V0 and VC1. The switch S1 is then closed and opened, resulting in a voltage V1' equal to half V1 plus a quarter of the sum of V0 and Vc1. The switch S2 is then closed and opened, resulting in a voltage V2' as described above. The comparator 130 then compares V2' to V3.

Figure 4:
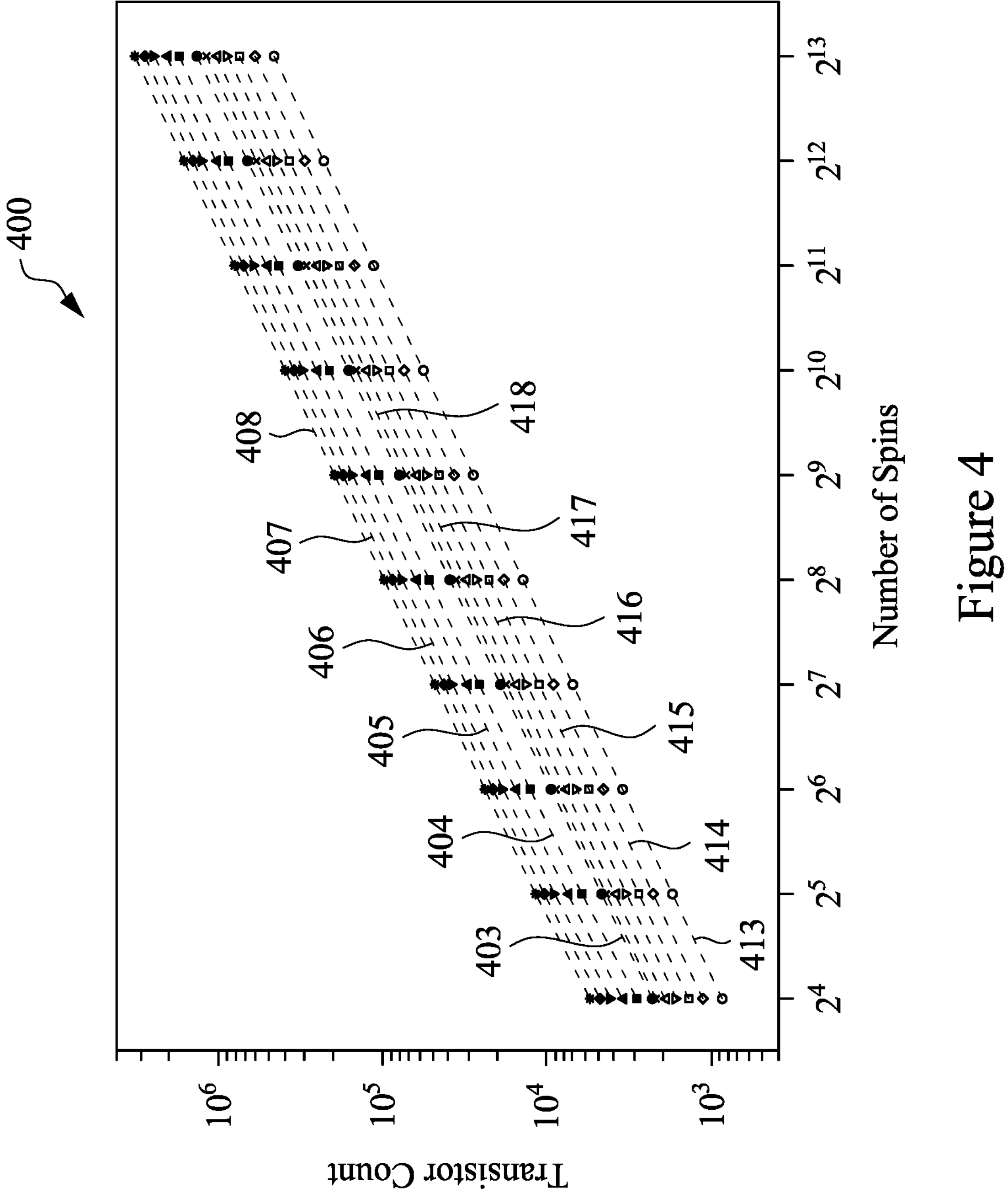
FIG. 4 is a graph illustrating transistor counts in an annealing processor, in accordance with some embodiments.

FIG. 4 is a graph 400 illustrating the number of transistors in an annealing processor, in accordance with some embodiments. The horizontal axis is the number of spin states. The vertical axis is the transistor count. The graphs 40*x* represent the transistor count in traditional annealing processors, where represents the number of bits. The graphs 41*x* represent the transistor count in an annealing processor 100 in accordance with some embodiments. As can be seen, the transistor count in the annealing processor 100 is greatly reduced compared to the transistor count in traditional annealing processors. In some embodiments, the number of transistors is reduced by a factor of four in an annealing processor 100 with respect to traditional annealing processes.

Figure 5:
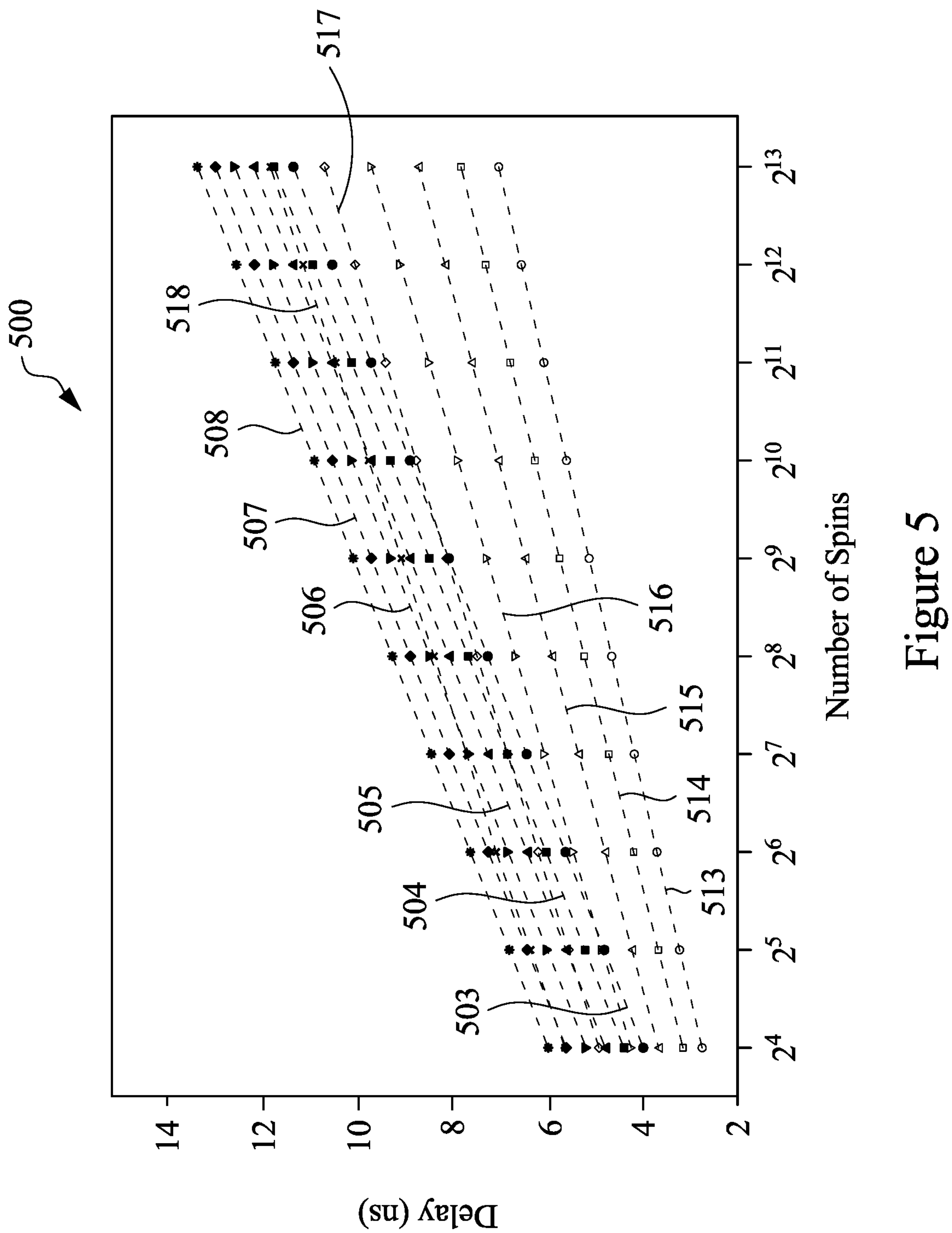
FIG. 5 is a graph illustrating computation delay in an annealing processor, in accordance with some embodiments.

FIG. 5 is a graph 500 illustrating the number of transistors in an annealing processor, in accordance with some embodiments. The horizontal axis is the number of spins. The vertical axis is the computation delay. The graphs 50*x* represent the computation delay in traditional annealing processors, where represents the number of bits. The graphs 51*x* represent the transistor count in an annealing processor 100, in accordance with some embodiments. As can be seen, the computation delay in the annealing processor 100 is greatly reduced compared to the computation delay in traditional annealing processors.

Figure 6:
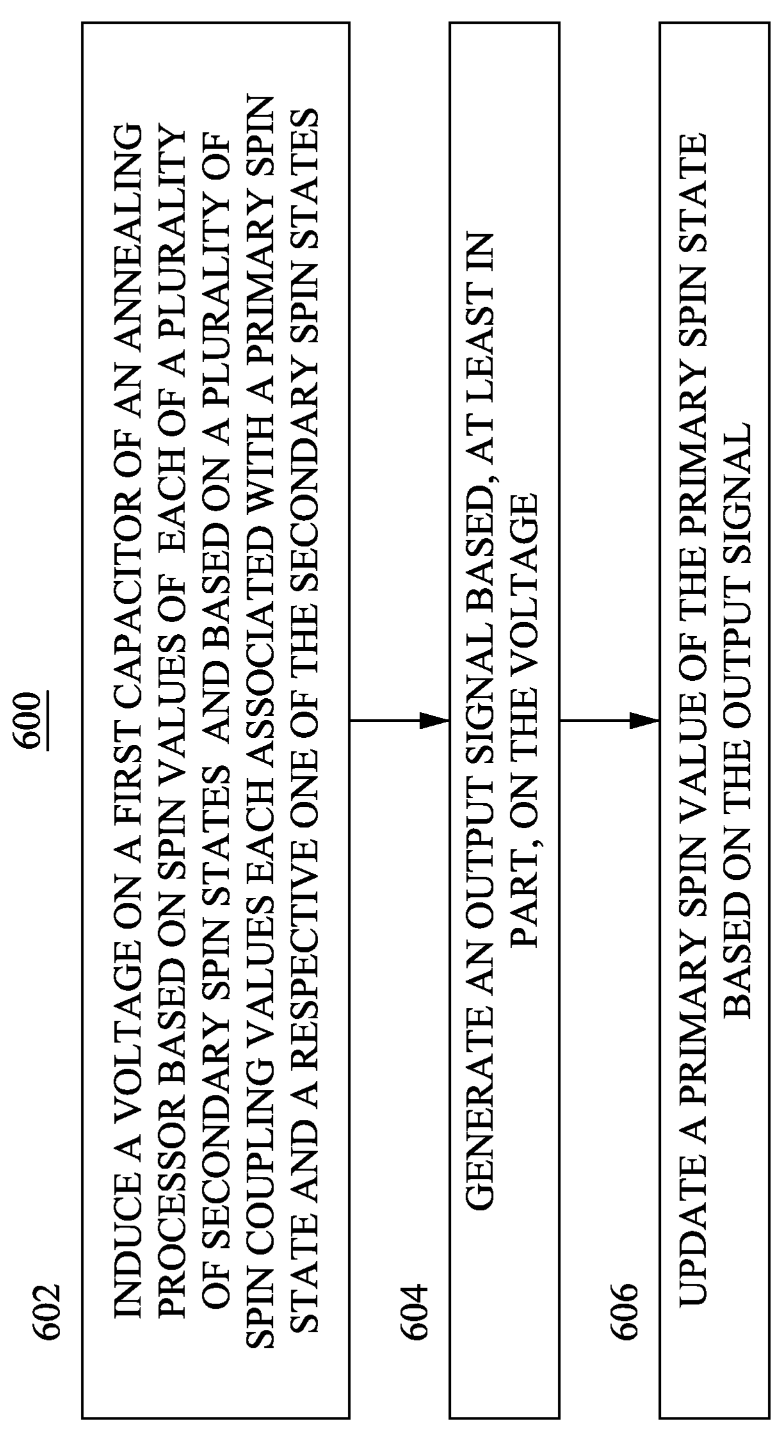
FIG. 6 is a flow diagram of a process for updating spin states of an optimization problem, in accordance with some embodiments.

FIG. 6 is a flow diagram of a method 600 for operating an annealing processor, in accordance with some embodiments. The method 600 can utilize processes, components, and systems described in relation to FIGS. 1A-5. At 602, the method 600 includes inducing a voltage on a first capacitor of an annealing processor based on spin values of each of a plurality of secondary spin states and based on a plurality of spin coupling values each associated with a primary spin state and a respective one of the secondary spin states. One example of a first capacitor is the capacitor C2 of FIG. 3A. One example of an annealing processor is the annealing processor 100 of FIG. 1A. One example of spin states are the spin states 102 of FIG. 1B. At 604, the method 600 includes generating an output signal based, at least in part, on the voltage. At 606, the method 600 includes updating a primary spin value of the primary spin state based on the output signal.

Figure 7:
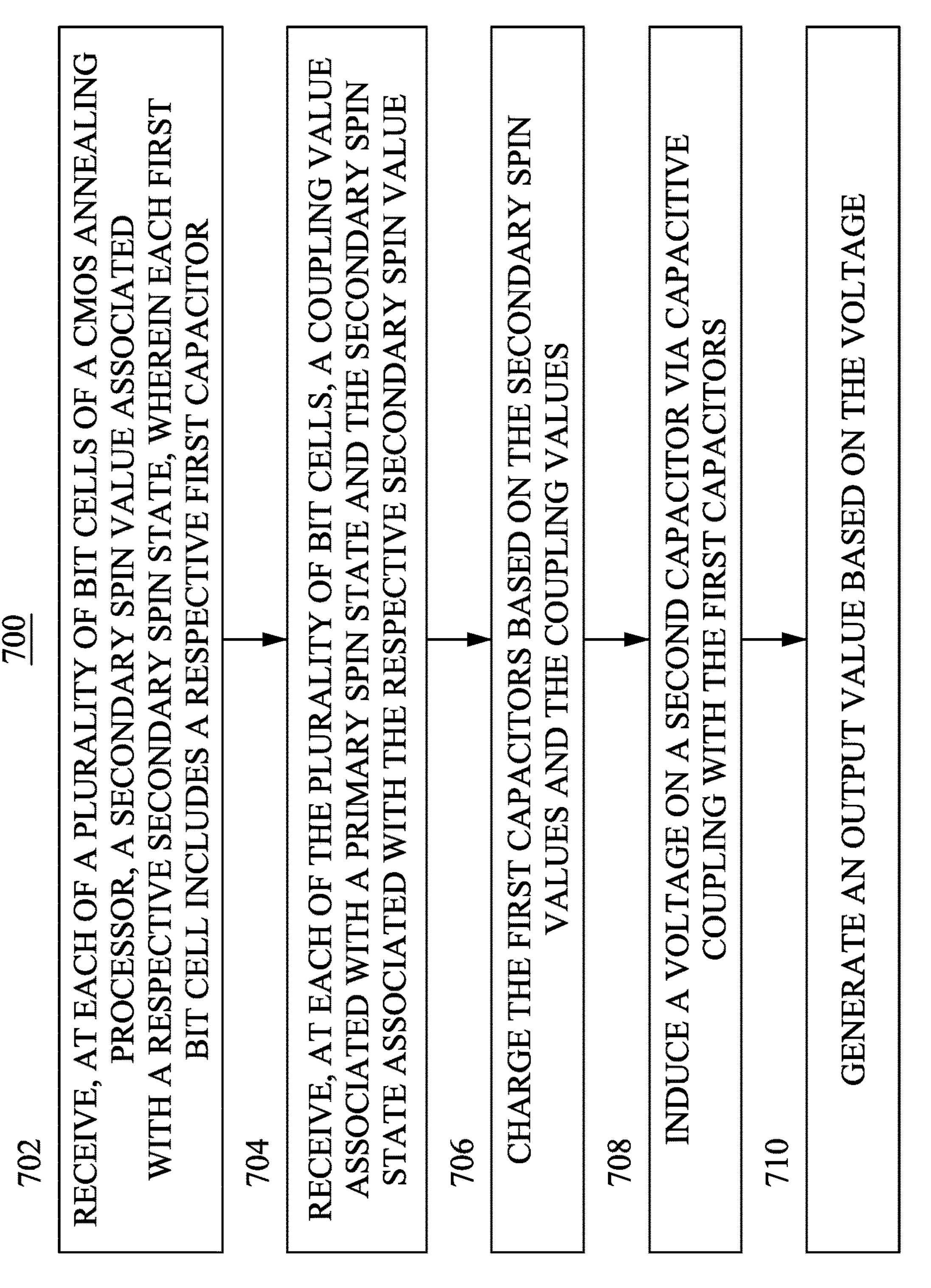
FIG. 7 is a flow diagram of a process for updating spin states of an optimization problem, in accordance with some embodiments.

FIG. 7 is a flow diagram of a method 700 for operating an annealing processor, in accordance with some embodiments. The method 700 can utilize processes, components, and systems described in relation to FIGS. 1A-5. At 702, the method 700 includes receiving, at each of a plurality of bit cells of a CMOS annealing processor, a secondary spin value associated with a respective secondary spin state, wherein each first bit cell includes a respective first capacitor. One example of bit cells are the bit cells 122 of FIG. 3A. One example of an annealing processor is the annealing processor 100 of FIG. 1A. One example of a first capacitor is the capacitor C1 of FIG. 3A. At 704, the method 700 includes receiving, at each of the plurality of bit cells, a coupling value associated with a primary spin state and the secondary spin state associated with the respective secondary spin value. At 706, the method 700 includes charging the first capacitors based on the secondary spin values and the coupling values. At 708, the method 700 includes inducing a voltage on a second capacitor via capacitive coupling with the first capacitors. One example of a second capacitor is the capacitor C2 of FIG. 3A. At 710, the method 700 includes generating an output value based on the voltage.

Embodiments of the present disclosure provide a CMOS based annealing processor that can effectively and efficiently solve combinatorial optimization problems. A combinatorial optimization problem is modeled as a plurality of spin states that are each coupled with the other spin states. The annealing processor includes a plurality of capacitive spin update circuits. Each capacitive spin update circuit is able to determine whether a spin state should be updated based on the values of all of the other spin states and corresponding coupling values. The capacitive spin update circuits operate in parallel with each other such that multiple spin states can be updated substantially simultaneously with each other.

Each capacitive spin update circuit includes a bit cell for each spin state. Each bit cell includes one or more logic gates and a first capacitor. Each first capacitor is coupled to a bitline. Each bit cell represents a respective spin state and receives a spin value of the spin state and a coupling value associated with the spin state. The spin update circuit includes a second capacitor that can be selectively coupled and decoupled from the bitline. During a spin update process, each first capacitor is charged to a value based on the corresponding spin state value and spin coupling value. A voltage is induced on the second capacitor via capacitive coupling with each of the first capacitors. The spin update circuit determines whether or not a spin value should be updated based, in part, on the voltage induced on the second capacitor.

The function of the logic gate and the capacitive coupling of each of the bit cells results in an efficient and effective process for updating spin states in a fully connected manner. The result is a CMOS based annealing process with low area overheads, rapid computation, and low power consumption. The CMOS annealing processor can, thus, be utilized to solve very difficult combinatorial optimization problems effectively and efficiently.

In some embodiment, a method includes inducing a voltage on a first capacitor of an annealing processor based on spin values of each of a plurality of secondary spin states and based on a plurality of spin coupling values each associated with a primary spin state and a respective one of the secondary spin states. The method includes generating an output signal based, at least in part, on the voltage and updating a primary spin value of the primary spin state based on the output signal.

In some embodiments, an annealing processor includes a first bitline, a plurality of first bit cells. Each first bit cell includes one or more logic gates and a first capacitor coupled between the one or more logic gates and the first bitline. The annealing processor includes a second capacitor and a first switch configured to selectively couple the second capacitor to each of the first capacitors.

In some embodiments, a method includes receiving, at each of a plurality of bit cells of a CMOS annealing processor, a secondary spin value associated with a respective secondary spin state, wherein each first bit cell includes a respective first capacitor and receiving, at each of the plurality of bit cells, a coupling value associated with a primary spin state and the secondary spin state associated with the respective secondary spin value. The method includes charging the first capacitors based on the secondary spin values and the coupling values, inducing a voltage on a second capacitor via capacitive coupling with the first capacitors, and generating an output value based on the voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

inducing a voltage on a first capacitor of an annealing processor based on spin values of each of a plurality of secondary spin states and based on a plurality of spin coupling values each associated with a primary spin state and a respective one of the secondary spin states;

generating an output signal based, at least in part, on the voltage;

updating a primary spin value of the primary spin state based on the output signal;

selectively coupling the first capacitor to a first bitline;

selectively coupled the first bitline to ground;

applying, while the bitline is coupled to ground, a pulse to each of a plurality of bit cells, each bit cell having one or more logic gates and a second capacitor;

decoupling the first bitline from ground;

turning off the voltage pulse while the bitline is decoupled from ground; and inducing the voltage on the first capacitor via charge coupling with second capacitors.

2. The method of claim 1, comprising finding a ground state of an Ising model based, at least in part, on the output signal.

3. The method of claim 1, wherein finding the ground state includes computing a Hamiltonian function associated with the secondary spin states and the primary spin states.

4. The method of claim 1, comprising:

decoupling the first capacitor from the bitline; and generating the output value with a comparator having a first input coupled to the first capacitor.

5. The method of claim 4, comprising inducing a second voltage on a third capacitor coupled to a second input of the comparator and configured to be selectively coupled and decoupled from a second bitline.

6. The method of claim 5, wherein inducing the second voltage on the third capacitor includes:

inducing respective third voltages on each of a plurality of fourth capacitors; and after inducing the respective third voltage, selectively coupling each of the fourth capacitors to the third capacitor.

7. An annealing processor, comprising:

a first bitline;

a plurality of first bit cells, each first bit cell including:

one or more logic gates; and a first capacitor coupled between the one or more logic gates and the first bitline;

a second capacitor;

a first switch configured to selectively couple the second capacitor to each of the first capacitors;

a comparator having:

a first input coupled to the second capacitor;

a second input; and an output, a plurality of second bitlines;

a plurality of groups of second bit cells, each group of second bit cells being coupled to a respective second bitlines; and a plurality of third capacitors; and a plurality of second switches configured to selectively couple a respective one of the third capacitors to a respective second bitline.

8. The annealing processor of claim 7, wherein the one or more logic gates of each bit cell includes an XOR gate having:

a first input;

a second input; and an output.

9. The annealing processor of claim 8, wherein the one or more logic gates of each bit cell includes a NAND gate having:

an output coupled to first capacitor; and a first input coupled to the output of the XOR gate; and a second input.

10. The annealing processor of claim 9, wherein the first input of the XOR gate receives a secondary spin value associated with a respective secondary spin state, wherein the second input of the XOR gate receives a respective spin coupling value associated with the secondary spin value.

11. The annealing processor of claim 7, wherein each first bit cell is associated with a respective secondary spin state, wherein the comparator is configured to provide an output value indicative of an interaction of a primary spin state with each of the secondary second spin states.

12. The annealing processor of claim 7, further comprising processing circuitry configured to update a primary spin value of the primary spin state based on the output value of the comparator.

13. The annealing processor of claim 7, wherein at least one of the third capacitors is coupled to the second input of the comparator.

14. The annealing processor of claim 7, wherein the second bit cells are substantially identical to the first bit cells.

15. A method, comprising:

receiving, at each of a plurality of first bit cells and second bit cells of a CMOS annealing processor, a secondary spin value associated with a respective secondary spin state, wherein each first bit cell and each second bit cell includes a respective first capacitor, wherein the first bit cells are coupled to a first bitline, wherein the second bit cells are coupled to a second bitline;

receiving, at each of the plurality of first bit cells and second bit cells, a coupling value associated with a primary spin state and the secondary spin state associated with the respective secondary spin value;

charging the first capacitors based on the secondary spin values and the coupling values;

inducing a first voltage on a second capacitor via capacitive coupling with the first capacitors of the first bit cells via the first bit line;

inducing a second voltage on a third capacitor via capacitive coupling with the first capacitors of the second bit cells via the second bit line;

providing the first voltage to a first input of a comparator;

providing the second voltage a second input of the comparator; and generating an output value with the comparator based on the first voltage and the second voltage.

16. The method of claim 15, comprising charging the first capacitors by supplying a pulse to each of the first bit cells and the second bit cells.

17. The method of claim 16, comprising finding a ground state of an Ising model based, at least in part, on the output value.

18. The method of claim 15, wherein each first bit cell includes a logic gate.

19. The method of claim 15, wherein each first bit cell includes an XOR gate, having:

a first input;

a second input; and an output.

20. The method of claim 19, wherein each first bit cell includes a NAND gate having an output coupled to first capacitor and an input coupled to an output of the XOR gate.

* * * * *